US006967895B2

(12) United States Patent
Okada

(10) Patent No.: US 6,967,895 B2
(45) Date of Patent: Nov. 22, 2005

(54) CLOCK GENERATION CIRCUIT AND SEMICONDUCTOR MEMORY DEVICE USING THE SAME

(75) Inventor: Kazuyuki Okada, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/845,082

(22) Filed: May 14, 2004

(65) Prior Publication Data
US 2004/0257889 A1 Dec. 23, 2004

(30) Foreign Application Priority Data
May 15, 2003 (JP) .............................. 2003-136750

(51) Int. Cl.[7] .............................................. G11C 8/00
(52) U.S. Cl. ...................................... 365/233; 365/193
(58) Field of Search ........................... 365/193, 189.05, 365/233

(56) References Cited

U.S. PATENT DOCUMENTS 6,680,869 B2 * 1/2004 Sonoda et al. .......... 365/189.05
2003/0217225 A1 * 11/2003 Jang et al. ................... 711/105

FOREIGN PATENT DOCUMENTS

JP  2000-114954  4/2000
JP  2001-126481  5/2001

* cited by examiner

Primary Examiner—Son Mai
(74) Attorney, Agent, or Firm—Young & Thompson

(57) ABSTRACT

In an internal clock control circuit (5) that receives a $DQS_E$ signal whose timings have been controlled by a CLK signal received by a register (3) and a write CMD received by an enable signal control circuit (4), by a DQSin signal output from a first-stage input circuit 2 for a DQS signal, and the $DQS_E$ signal, two NAND circuits constituting a flip flop circuit turn a p-channel transistor (Q) on when a signal waveform in the first cycle is input, and off when signal waveforms in the second or subsequent cycle.

8 Claims, 5 Drawing Sheets

CLOCK GENERATION CIRCUIT AND SEMICONDUCTOR MEMORY DEVICE USING THE SAME

BACKGROUND OF THE INVENTION (1) Field of the Invention

The present invention relates to a clock generation circuit that converts an external data strobe (DQS) signal into an internal data strobe (DQSin) signal to generate an internal clock (DQSclk) signal used for hold timings of input external data ($DQ_1$ to $DQ_N$), and also to a semiconductor memory device including therein the clock generation circuit and input circuit units ($1_{-1}$ to $1_{-N}$) for the respective data signals, each of which circuit units converts an external data ($DQ_1$ to $DQ_N$) signal into an internal data ($DQ_1$in to $DQ_N$in) signal to latch internal data ($DQ_1$in to $DQ_N$in) for write. In particular, the present invention relates to a semiconductor memory device capable of setting the sane setup time Ts and the same hold time Th for all waveforms of the internal data signals even in case of high-rate data signals.

(2) Description of the Related Art

FIG. 1 shows a fundamental construction of a conventional semiconductor device of this kind. As shown in FIG. 1, external input data ($DQ_1$ to $DQ_N$) signals are input together with a reference voltage $V_{REF}$ to first-stage input circuits 11 of data input circuits $1_{-1}$ to $1_{-N}$, respectively.

In recent years, an increase in speed of semiconductor memory devices has been progressed. For example, DRAM (Dynamic Random Access Memory) has been developed from synchronous type SDRAM (synchronous DRAM) to DDR (Double Data Rate)-SDRAM. That is, in place of the synchronous system in which a single piece of data is exchanged at each clock pulse, a DDR system has been standardized in which each clock pulse is functionally divided to exchange two successive pieces of data at the respective rising and falling edges of the clock pulse.

Further, in a DDR2 system as a development of a DDR system, exchanges of data are successively performed at clock pulses of a clock signal CLK as shown in FIG. 2, thereby intending an increase in speed. The DDR2 system initially aimed at 300 MHz or more. However, the frequency to be coped with has increased to 667 MHz lately, as a result of progress to a very high speed.

An ordinary semiconductor memory device includes therein an input circuit unit for amplifying an external input data signal as described above to a signal of amplitude capable of operating in an internal circuit. Because the output of the input circuit unit rises and falls on the basis of rising and falling of the external input data signal, respectively, there arises a difference in rate of each of the rising and falling between the output of the input circuit unit and the external input data signal.

In general, as shown in FIG. 1, other than the external input data ($DQ_1$ to $DQ_N$) signals input to the respective data input circuit units $1_{-1}$ to $1_{-N}$, an external data strobe signal (hereinafter referred to as DQS signal) as a high-rate signal for indicating write timings for the external input data ($DQ_1$ to $DQ_N$) in the DDR system, is input together with the reference voltage $V_{REF}$ to a first-stage input circuit 2 used in common differently from the input circuit units $1_{-1}$ to $1_{-N}$.

Paying attention to the input circuit unit $1_{-1}$ by way of example, an internal data ($DQ_1$in) signal output from the first-stage input circuit 11 is sent to two input latch circuits 12a and 12b. On the other hand, an internal data strobe signal (hereinafter referred to as DQSin signal) output from the first-stage input circuit 2 is converted into an internal clock (hereinafter DQSclk signal), which becomes latch signals (hereinafter referred to as $LT_{SA}$ signal and $LT_{SB}$ signal) different in phase by 180 degrees from each other to be sent to the respective input latch circuits 12a and 12b.

Thus, also referring to FIGS. 4 and 5, the DQSin signal is converted into the internal clock as the DQSclk signal, which becomes the $LT_{SA}$ signal and $LT_{SB}$ signal different in phase by 180 degrees from each other to be input to the respective input latch circuits 12a and 12b. On the other hand, the internal data ($DQ_1$in) signal amplified in and output from the first-stage input circuit 11 is latched with a difference in phase by 180 degrees in the respective input latch circuits 12a and 12b by the $LT_{SA}$ signal and $LT_{SB}$ signal different in phase by 180 degrees from each other, and then used for write into the memory at rising and falling edges of the DQS signal.

In this construction, a relative delay may occur in each rising edge and each falling edge of the DQS signal and thus the setup time Ts and the hold time Th for data write latch in the input latch circuits 12a and 12b may become uneven because of the difference in rate between the rising and falling edges. Under certain conditions, the input latch circuits 12a and 12b may latch data erroneously between high (H) level and low (L) level of the data.

To solve this problem, an input circuit, for example, as the construction of a first-stage input circuit, is disclosed in which internal input data corresponding to external input data is output differentially in accordance with currents flowing in a pair of transistors to which the external input data and a reference voltage are input, respectively, and the quantity of current of the output is controlled in accordance with the level of the internal input data (for example, see JP-A-2000-114954, FIG. 1, FIG. 4).

Further, a semiconductor integrated circuit as shown in FIG. 4 is known in which improvement of the margin between the setup time Ts and the hold time Th to be defined with respect to an input data (DQ) signal is intended to cope with an increase in speed (for example, see JP-A-2001-126481, FIG. 1, FIG. 12).

The difference of the construction of FIG. 4 from the construction of FIG. 3 is in the point that a delay circuit 13, a latch signal generation circuit 102, and a latch signal generation control circuit 103 are added.

In an input circuit unit 101, the delay circuit 13 delays the internal data (DQin) signal output from the first-stage input circuit 11 synchronously with generation of the latch signals ($LT_{SA}$ signal and $LT_{SB}$ signal) to be input to the input latch circuits 12a and 12b. Under the control of the latch signal generation control circuit 103, the latch signal generation circuit 102 generates from the output of the first-stage input circuit 2 the $LT_{SA}$ signal and the $LT_{SB}$ signal different in phase by 180 degrees from each other. The latch signal generation control circuit 103 includes therein an oscillator circuit, two sets of dummy input circuit units, and a comparator circuit. The latch signal generation control circuit 103 makes automatic control such that the difference between the delay time from a rising edge of the DSQ signal to the rising edge of the $LT_{SA}$ signal corresponding to the rising edge of the DSQ signal and the delay time from a falling edge of the DSQ signal to the falling edge of the $LT_{SB}$ signal corresponding to the falling edge of the DSQ signal is within a permissible range of zero or almost zero.

In the above-described conventional semiconductor memory device, the delay time of each of rising and falling edges of a signal to be treated is improved/controlled so that the setup time or the hold time is made even. However, at present, at which an increase in rate of signals to be treated is being progressed, particularly in case of a high-speed DDR2 system, only by the above-described technique, it is difficult to make all waveforms identical and thus a difference arises in the setup time or the hold time.

The reason is as follows. Particularly in case of the high-speed DDR2 system, because rising and falling edges of a clock are used for data write, the amplitude of a high-rate data signal externally input is very small and full swing to correspond to the high frequency to the rising and falling edges of the signal is difficult.

For example, as shown in FIG. 5, the signal waveform becomes dull due to the ON resistance of each transistor constituting the circuit, wiring resistance, and wiring capacitance, and in particular, the waveform does not reach the stable level to the power supply or ground in the second or subsequent cycle.

SUMMARY OF THE INVENTION

An object of the present invention is to provide a semiconductor memory device in which the waveform in the first cycle by a data strobe signal can be controlled so that the same setup time Ts and the same hold time Th can be set for all waveforms of internal data signals to be latched even in case of high-rate data signals.

To attain the above object, according to the present invention, an internal clock signal is controlled by a flip flop circuit and an auxiliary voltage is given to the internal clock signal only when a clock in the first cycle is input, for example, by turning on a transistor connecting the internal clock signal to a power supply.

A clock generation circuit used in an internal circuit according to the present invention is a circuit that converts an external data strobe (DQS) signal into an internal data strobe (DQSin) signal to generate an internal clock (DQSclk) signal used for hold timings of input external data ($DQ_1$ to $DQ_N$). The circuit comprises an internal clock control circuit that applies a specified auxiliary voltage to a waveform of the internal clock (DQSclk) signal generated in the first cycle to output the internal clock (DQSclk) signal whose signal waveform in the first cycle has been formed into the same waveform an its signal waveform in the second or subsequent cycle, when the internal clock control circuit receives a data enable ($DQS_E$) signal for taking the external data ($DQ_1$ to $DQ_N$) in.

In this construction, because a shift occurs only in the signal waveform in the first cycle, by giving an adequate auxiliary voltage to the first internal clock, the same waveform as that in the second or subsequent cycle can be generated.

One specific internal clock control circuit comprises a p-channel transistor (Q) for supplying a predetermined voltage to the internal clock (DQSclk) signal, the p-channel transistor (Q) having a source and a drain connected to the internal clock (DQSclk) signal having a specified delay time relative to the internal data strobe (DQSin) signal, and a predetermined power supply, respectively; a flip flop circuit including first and second NAND circuits, the first NAND circuit receiving the data enable ($DQS_E$) signal, the second NAND circuit receiving the internal clock (DQSclk) signal connected through an inverter; and a third NAND circuit receiving an output of the flip flop circuit and the internal data strobe (DQSin) signal and connected to a gate of the p-channel transistor (Q).

In this construction, the internal clock control circuit can give the specified voltage through the p-channel transistor (Q) to the internal clock (DQSclk) signal only in relation to the waveform of the internal data strobe (DQSin) signal input in the first cycle when the data enable ($DQS_E$) signal is input.

A semiconductor memory device according to the present invention uses the above clock generation circuit to convert an external data strobe (DQS) signal into an internal data strobe (DQSin) signal to generate an internal clock (DQSclk) signal and generate latch signals ($LT_{SA}$ and $LT_{SB}$ signals) for writing external data ($DQ_1$ to $DQ_N$) in. Therefore, when receiving a DQS enable ($DQS_E$) signal for taking the external data strobe (DQS) signal in, a specified voltage can be applied to the internal clock (DQSclk) signal generated in the first cycle, to output the internal clock (DQSclk) signal whose signal waveform in the first cycle has been formed into the same waveform as its signal waveform in the second or subsequent cycle.

One specific means of an internal clock control circuit includes therein, as its principal components, a p-channel transistor (Q); a flip flop circuit including first and second NAND circuits; and a third NAND circuit. The p-channel transistor (Q) has a source and a drain connected to the internal clock (DQSclk) signal and a predetermined power supply, respectively, and supplies a predetermined voltage to the internal clock (DQSclk) signal. The flip flop circuit includes the first and second NAND circuits. The first NAND circuit receives a DQS enable ($DQS_E$) signal for taking the external data strobe (DQS) signal in. The second NAND circuit receives the internal clock (DQSclk) signal connected through an inverter. The third NAND circuit receives an output of the flip flop circuit and the internal data strobe (DQSin) signal and is connected to the gate of the p-channel transistor (Q).

In this construction, a specified voltage can be applied through the p-channel transistor (Q) to the internal clock (DQSclk) signal only in relation to the waveform of the internal data strobe (DQSin) signal input first when the DQS enable ($DQS_E$) signal is input.

The above semiconductor memory device can comprise a register that receives an external clock (CLK) and sets write timings in advance by programing to output; and an enable signal control circuit that outputs the DQS enable ($DQS_E$) signal by a set output from the register when the enable signal control circuit receives an external command (CMD). Thus, by controlling the setting of timings, more accurate control of the internal clock (DQSclk) signal can be made.

DESCRIPTION OF THE PREFERRED EMBODIMENT

Hereinafter, an embodiment of the present invention will be described with reference to drawings.

Figure 6:
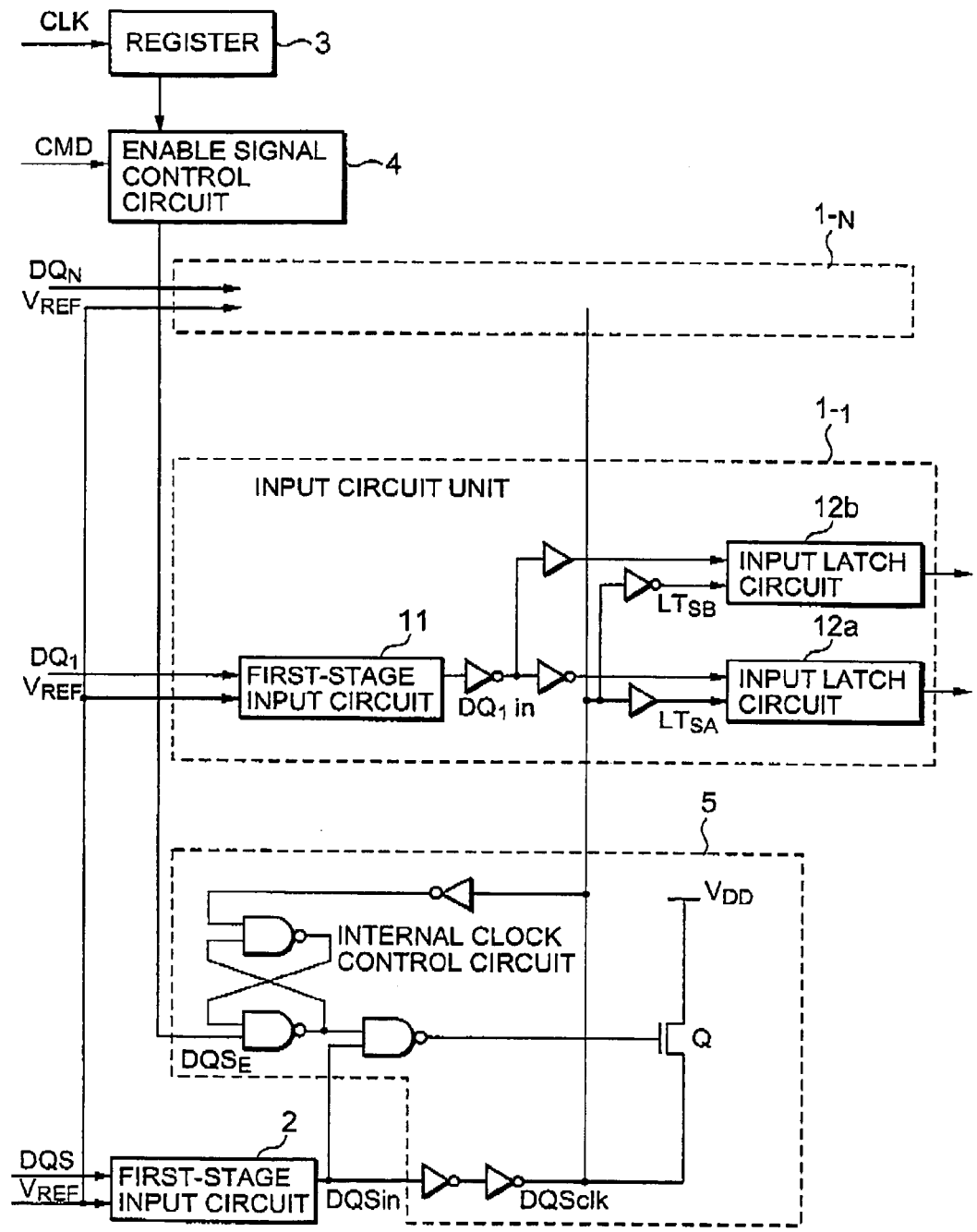
FIG. 6 is a diagram showing a fundamental circuit construction according to an embodiment of the present invention.
Figure 7:
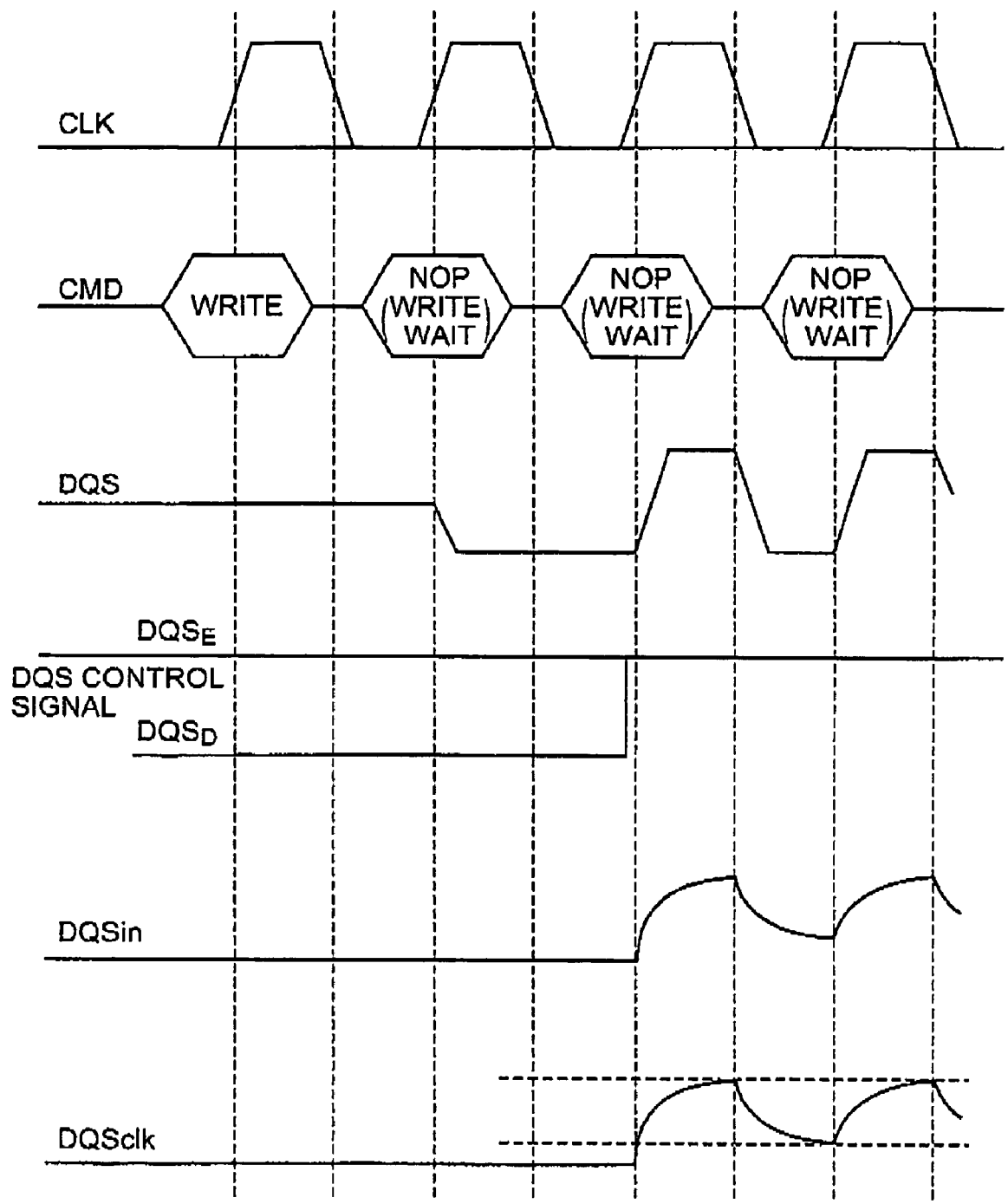
FIG. 7 is a time chart of parts of the embodiment.

FIG. 6 is a diagram showing a circuit construction according to an embodiment of the present invention.

The shown semiconductor memory device includes N input circuit units $1_{-1}$ to $1_{-N}$, a first-stage input circuit 2, a register 3, an enable signal control circuit 4, and an internal clock control circuit 5.

Figure 1:
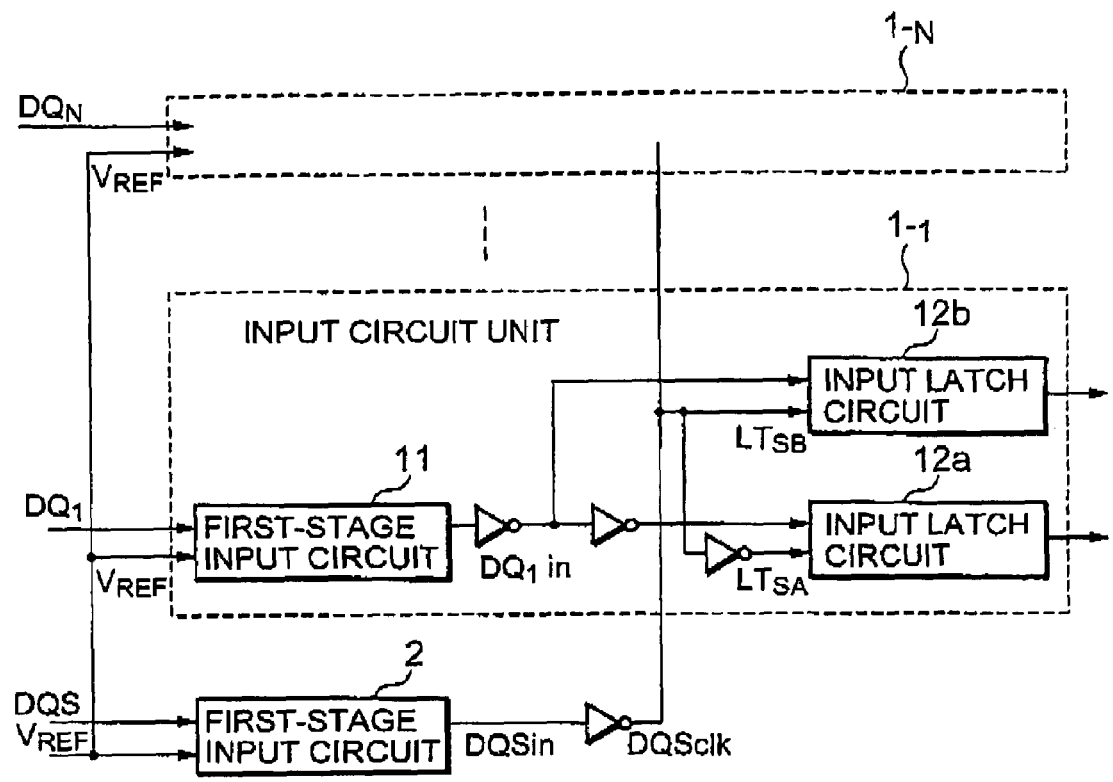
FIG. 1 is a diagram showing an example of a conventional fundamental circuit construction.

The difference of the semiconductor memory device of FIG. 6 from the conventional semiconductor memory device of FIG. 1 is in the point that the register 3, the enable signal control circuit 4, and the internal clock control circuit 5 are added.

Each of the input circuit units $1_{-1}$ to $1_{-N}$ is the first-stage circuit synchronous with an internal clock signal (hereinafter referred to as DQSclk signal). It is made up of a first-stage input circuit 11, two input latch circuits 12a and 12b, and inverters for sending, to the respective input latch circuits 12a and 12b, two latch signals (hereinafter referred to as $LT_{SA}$ signal and $LT_{SB}$ signal) one of which has been converted in phase by 180 degrees in comparison with the other. This circuit construction is fundamentally the same as that shown in FIG. 1.

As a representative of the input circuit units $1_{-1}$, to $1_{-N}$, the shown input circuit unit $1_{-1}$ will be described below because the same can apply to the other input circuit units.

The first-stage input circuit 11 receives an external input data signal (hereinafter referred to as $DQ_1$ signal) and a reference voltage $V_{REF}$ to amplify the input signal, and obtains an internal data signal (hereinafter referred to as $DQ_1$in signal) as an output. Each of the input latch circuits 12a and 12b comprises a flip flop circuit. The $LT_{SA}$ signal and $LT_{SB}$ signal for the respective input latch circuits 12a and 12b are obtained through inverters from the DQSclk signal received from the internal clock control circuit 5.

The first-stage input circuit 2 is provided in common to the input circuit units $1_{-1}$ to $1_{-N}$. It is fundamentally the same as that in a conventional semiconductor memory device. That is, the first-stage input circuit 2 receives an external data strobe signal (hereinafter referred to as DQS signal) and the reference voltage $V_{REF}$ to amplify the input signal, and outputs a DQSin signal to the internal clock control circuit 5.

The register 3 sends, to the enable signal control circuit 4, a control signal for controlling data input synchronously with an external clock signal (CLK signal). The timing for outputting the control signal can be changed by programming so that a predetermined signal waveform can be obtained.

While the enable signal control circuit 4 is receiving the control signal based on the setting of the register 3, if it externally receives a write command (CMD) separately, it outputs, to the internal clock control circuit 5, an instruction for writing external input data DQ as a DQS enable signal (hereinafter referred to as $DQS_E$ signal). That is, the enable signal control circuit 4 uses the $DQS_E$ signal to control activation timings for the DQS signal as a high-rate strobe signal for data write.

The internal clock control circuit 5 includes, as its principal components, a p-channel transistor (Q), a flip flop circuit including first and second NAND circuits, and a third NAND circuit.

The p-channel transistor (Q) is connected at its drain to the output of the first-stage input circuit 2 through inverters, and at its source to the power supply $V_{DD}$. Thus, when the p-channel transistor (Q) is on, it supplies an auxiliary voltage to the DQSclk signal supplied through the inverters from the DQSin signal as the output of the first-stage input circuit 2.

The flip flop circuit made up of the first and second NAND circuits receives the DQS enable ($DQS_E$) signal for taking the external data strobe (DQS) signal in the first NAND circuit, and the DQSclk signal connected through an inverter to the second NAND circuit. As described above, the $DQS_E$ signal is received from the enable signal control circuit 4.

The third NAND circuit receives the output of the flip flop circuit and the DQSin signal. The output of the third NAND circuit is connected to the gate of the p-channel transistor (Q).

Figure 2:
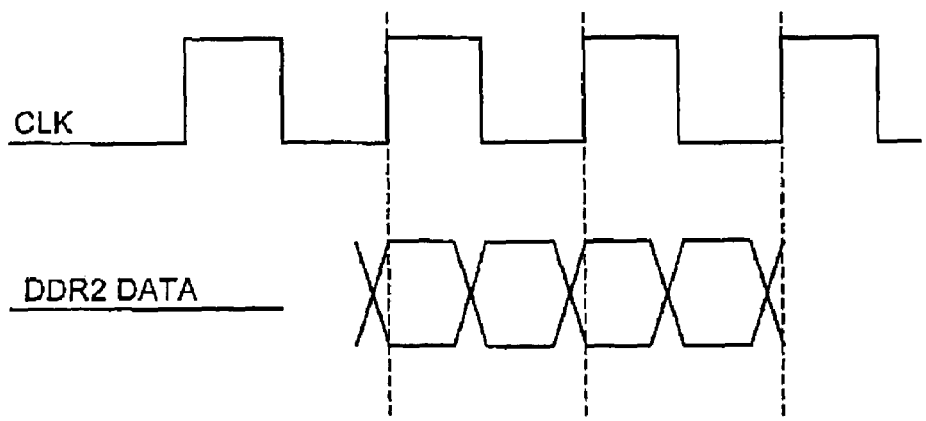
FIG. 2 is a time chart for explaining a DDR2 data in relation to a clock.
Figure 3:
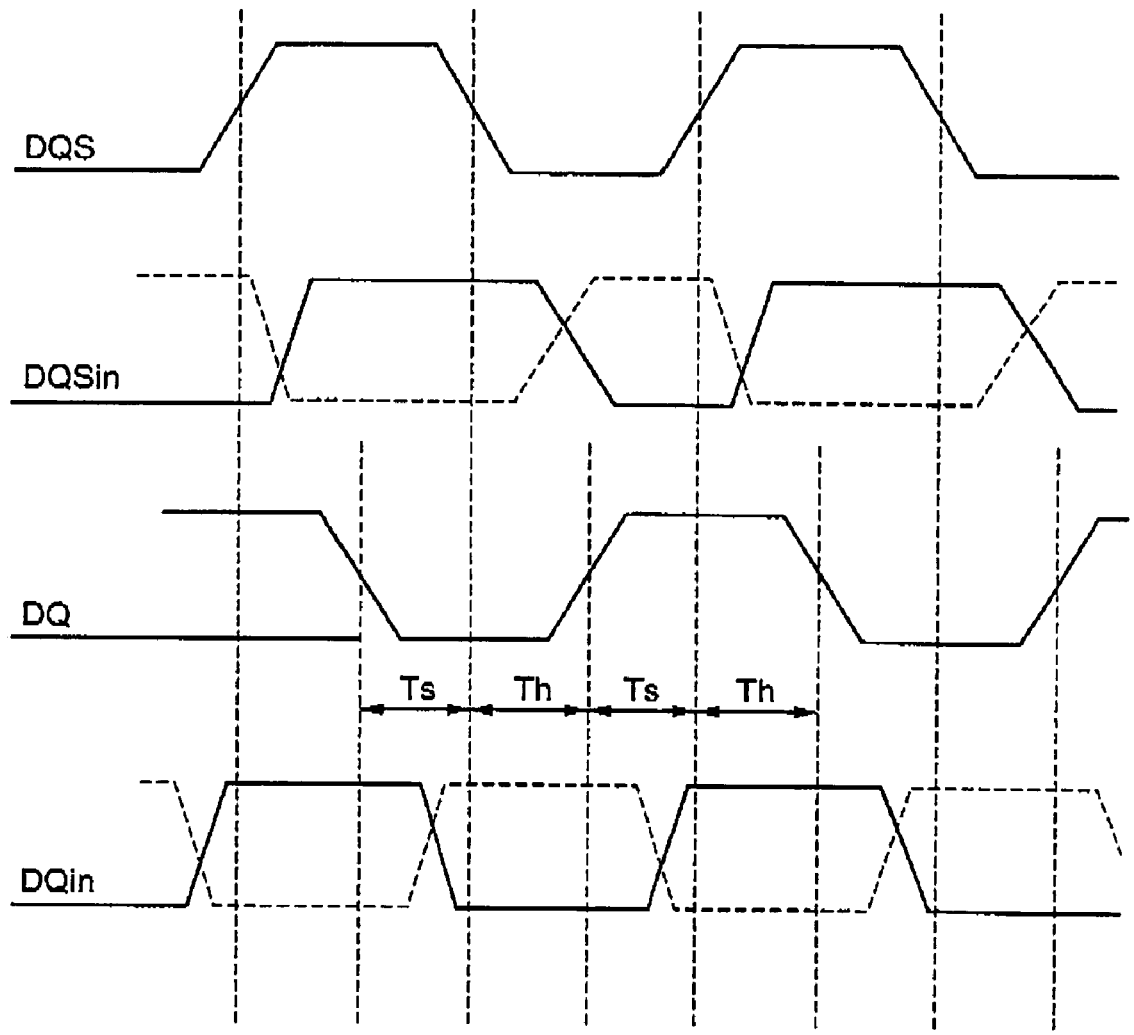
FIG. 3 is a time chart showing examples of waveforms in the interior and exterior of DDR data.
Figure 4:
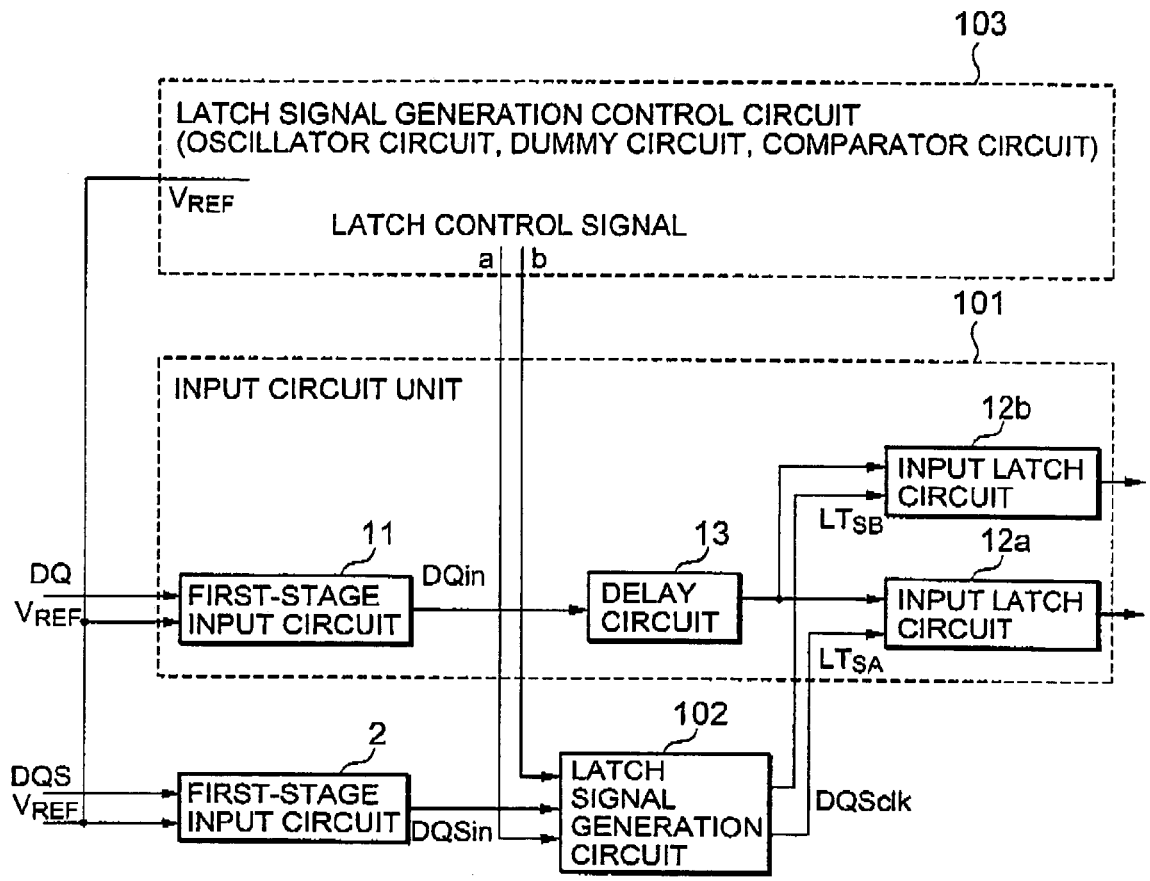
FIG. 4 is a diagram showing an example of another conventional fundamental circuit construction than that of FIG. 1.
Figure 5:
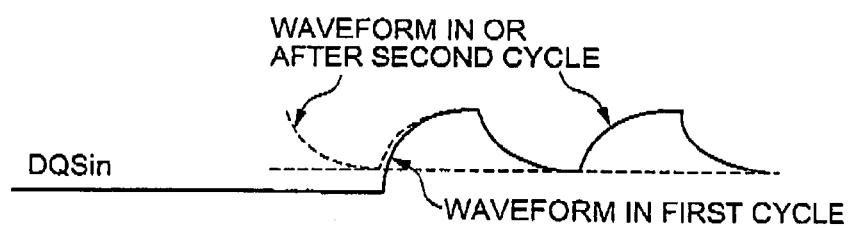
FIG. 5 is a time chart showing an example of a shift of a waveform of a high-rate signal.

Next, related operations will be described with reference to FIGS. 1 and 2.

First, a write command CMD is accepted by the enable signal control circuit 4 synchronously with a rising edge of the CLK signal being input to the register 3. The enable signal control circuit 4 sends out, to the internal clock control circuit 5, a $DQS_E$ signal as a DQS control signal at the rising edge of the CLK signal corresponding to the second write wait after the input of the write command CMD.

In accordance with the generation of the $DQS_E$ signal, the first-stage input circuit 2 accepts a DOS signal synchronously with the CLK signal. Therefore, the first-stage input circuit 2 outputs a DQSin signal of a waveform with dull rising and falling edges, as described above.

Initially in the internal clock control circuit 5, because no DQSin signal appears, the p-channel transistor (Q) is off. In the internal clock control circuit 5, by input of the DQS signal in the first cycle, the DQSin signal is input to the third NAND circuit to turn the p-channel transistor (Q) on.

On the other hand, the DQSin signal passes through inverters to become a DQSclk signal. The DQSclk signal is supplied to the input latch circuits 12a and 12b on one hand, and connected to the power supply $V_{DD}$ through the source and drain of the p-channel transistor (Q) on the other hand so that an auxiliary voltage is given when the p-channel transistor (Q) is on. As a result, the waveform of the DQSclk signal in the first cycle is raised to coincide with the stable waveform in the second or subsequent cycle.

When the DQSclk signal in the first cycle is output, the $DQS_E$ signal changes to high (H) level by the flip flop construction of the first and second NAND circuits to turn the p-channel transistor (Q) off. In the second or subsequent cycle after the above operation, the DQSclk signal can keep its stable waveform.

Further, as described above, the internal clock control circuit 5 carries out setting of timings in cooperation with the register 3 and the enable signal control circuit 4, and thereby makes control so that the signal waveform in the first cycle can coincide with the signal waveform in the second or subsequent cycle.

The above description has referred to a form of shown circuit construction and time chart. However, the circuit construction can be freely changed as far as the above function is satisfied. Thus, the above description does not limit the present invention. Further, the present invention is applicable to the whole of high-speed writing in a semiconductor memory device.

As described above, according to the present invention, a semiconductor memory device can be obtained in which an auxiliary voltage can be given by the internal clock control circuit only to the signal waveform in the first cycle in successive data write latch signals of the internal clock signal supplied to the input latch circuits for latching, and further timings for giving the auxiliary voltage can be controlled by the enable signal control circuits.

By this construction, even in case of high-rate data signals, an effect can be obtained that the clock waveform for high-speed data signal writing can be made even from the first cycle by controlling the signal waveform in the first cycle by the data strobe signal so that the same setup time Ts and the same hold time Th can be set for all waveforms of the internal data signal to be latched.

What is claimed is:

1. A clock generation circuit for generating an internal clock signal which is referred to determine hold timings of input external data, wherein the clock generation circuit:

converts an external data strobe signal into an internal data strobe signal;

comprises an internal clock control circuit that applies a predetermined voltage to the internal clock signal generated in a first cycle in response to a data enable signal for requesting to read the external data; and generates the predetermined voltage in order to correspond the waveform of the internal clock signal in the first cycle with the waveform of the internal clock signal in a second or subsequent cycle.

2. The clock generation circuit claimed in claim 1, wherein the internal clock control circuit comprises:

a p-channel transistor for supplying the predetermined voltage to the internal clock signal, the p-channel transistor having a source and a drain connected to the internal clock signal having a predetermined delay time relative to the internal data strobe signal, and a predetermined power supply, respectively;

a flip flop circuit including first and second NAND circuits, the first NAND circuit receiving the data enable signal, the second NAND circuit receiving the internal clock signal connected through an inverter; and a third NAND circuit receiving an output of the flip flop circuit and the internal data strobe signal and connected to a gate of the p-channel transistor, and wherein the internal clock control circuit gives the predetermined voltage through the p-channel transistor to the internal clock signal only in relation to a waveform of the internal data strobe signal input in the first cycle in response to the data enable signal.

3. A semiconductor memory device in which an external data strobe (DQS) signal is converted into an internal data strobe (DQSin) signal to generate an internal clock (DQSclk) signal and latch external data (DQ1 to DQN) for writing, the semiconductor memory device comprising a clock generation circuit that applies a predetermined voltage to the internal clock (DQSclk) signal generating a signal waveform in a first cycle, to output the internal clock (DQSclk) signal of which the signal waveform in the first cycle has been formed into the same waveform as a signal waveform in a second or subsequent cycle, when the clock generation circuit receives a DQS enable (DQSE) signal for taking the external data strobe (DQS) signal in.

4. A semiconductor memory device in which an external data strobe (DQS) signal is converted into an internal data strobe (DQSin) signal to generate an internal clock (DQSclk) signal and latch external data (DQ1 to DQN) for writing, the semiconductor memory device comprising a clock generation circuit that sets a predetermined delay time to the internal clock (DQSclk) signal relative to the internal data strobe (DQSin) signal, connects a predetermined voltage through a transistor (Q) to the internal clock (DQSclk) signal, and increases a driver size of the transistor (Q) only in relation to a signal waveform in a first cycle when the clock generation circuit receives a DQS enable (DQSE) signal for taking the external data strobe (DQS) signal in, so as to output the internal clock (DQSclk) signal whose signal waveform in the first cycle has been formed into the same waveform as its signal waveform in a second or subsequent cycle.

5. A semiconductor memory device in which an external data strobe (DQS) signal is converted into an internal data strobe (DQSin) signal to generate an internal clock (DQSclk) signal and latch external data (DQ1 to DQN) for writing, the semiconductor memory device comprising a clock generation circuit comprising a p-channel transistor (Q) for supplying a predetermined voltage to the internal clock (DQSclk) signal, the p-channel transistor (Q) having a source and a drain connected to the internal clock (DQSclk) signal having a predetermined delay time relative to the internal data strobe (DQSin) signal, and a predetermined power supply, respectively; a flip flop circuit including first and second NAND circuits, the first NAND circuit receiving a DQS enable (DQSE) signal for taking the external data strobe (DQS) signal in, the second NAND circuit receiving the internal clock (DQSclk) signal connected through an inverter; and a third NAND circuit receiving an output of the flip flop circuit and the internal data strobe (DQSin) signal and connected to a gate of the p-channel transistor (Q), the clock generation circuit giving the predetermined voltage through the p-channel transistor (Q) to the internal clock (DQSclk) signal only in relation to a waveform of the internal data strobe (DQSin) signal input first when the DQS enable (DQSE) signal is input.

6. The semiconductor memory device claimed in claim 3, further comprising a register that receives an external clock (CLK) and sets write timings in advance by programming to output; and an enable signal control circuit that outputs the DQS enable (DQSE) signal by a set output from the register when the enable signal control circuit receives an external command (CMD).

7. The semiconductor memory device claimed in claim 4, further comprising a register that receives an external clock (CLK) and sets write timings in advance by programming to output; and an enable signal control circuit that outputs the DQS enable (DQSE) signal by a set output from the register when the enable signal control circuit receives an external command (CMD).

8. The semiconductor memory device claimed in claim 5, further comprising a register that receives an external clock (CLK) and sets write timings in advance by programming to output; and an enable signal control circuit that outputs the DQS enable (DQSE) signal by a set output from the register when the enable signal control circuit receives an external command (CMD).

* * * * *